United States Patent [19]
Nakabayashi et al.

[11] Patent Number: 5,144,243
[45] Date of Patent: Sep. 1, 1992

[54] RF COIL SYSTEM FOR USE IN MAGNETIC RESONANCE IMAGING APPARATUS

[75] Inventors: Kazuto Nakabayashi, Ootawara, Japan; Timothy R. Fox, Chicago, Ill.

[73] Assignee: Kabushiki Kaisha Toshiba, Kawasaki, Japan

[21] Appl. No.: 654,183

[22] Filed: Feb. 13, 1991

[30] Foreign Application Priority Data

Feb. 14, 1990 [JP] Japan ................. 2-31474

[51] Int. Cl.⁵ ............................. G01R 33/20
[52] U.S. Cl. ................................. 324/318
[58] Field of Search ............. 324/300, 301, 302, 307, 324/309, 318, 322; 128/653 SC, 653 A

[56] References Cited

U.S. PATENT DOCUMENTS

| | | | |
|---|---|---|---|
| 4,591,790 | 5/1986 | Takahashi | 324/318 |
| 4,751,465 | 6/1988 | Zens | 324/322 |
| 4,825,162 | 4/1989 | Roemer et al. | 324/302 |
| 4,859,947 | 8/1989 | Boskamp | 324/318 |
| 4,924,868 | 5/1990 | Krause et al. | 128/653 SC |
| 4,943,775 | 7/1990 | Boskamp | 324/322 |
| 4,975,644 | 12/1990 | Fox | 324/318 |
| 4,985,679 | 1/1991 | McDougall | 324/318 |
| 5,057,778 | 10/1991 | Rath | 324/322 |

FOREIGN PATENT DOCUMENTS

0374994A1  6/1990  European Pat. Off. .

Primary Examiner—Michael J. Tokar
Attorney, Agent, or Firm—Finnegan, Henderson, Farabow, Garrett and Dunner

[57] ABSTRACT

An RF coil system, used for a magnetic resonance imaging apparatus and adapted to perform at least one of application of an excitation high-frequency magnetic field and detection of magnetic resonance signals, comprises a plurality of coil elements arranged at regularly spaced intervals without overlap therebetween, an RF circuit for putting at least one of the coil elements into an operative state or an inoperative state, a neutralizing circuit for neutralizing inductive coupling between the coil elements, a tuning circuit for tuning at least one of the coil elements to a given frequency, an adder circuit for adding an output signal of the tuning circuit and conductors for electrically connecting the coil elements, the RF circuit, the neutralizing circuit and the adder circuit.

15 Claims, 9 Drawing Sheets

RF COIL SYSTEM FOR USE IN MAGNETIC RESONANCE IMAGING APPARATUS

BACKGROUND OF THE INVENTION

Field of the Invention

The present invention relates to an RF coil system for use in a magnetic resonance imaging apparatus for obtaining morphological information, such as cross-sectional NMR images, and functional information, such as spectroscopy, from a subject under examination (organism) by utilizing nuclear magnetic resonance (NMR) phenomena.

RF coil systems for use in a magnetic resonance imaging apparatus and adapted for transmission of an excitation pulse and/or reception of magnetic resonance signals include a whole-body coil which is embedded in a gantry beforehand and a coil which is not embedded in the gantry beforehand. In general, the former is adapted for transmission and reception, while the latter is adapted for reception only. For the latter a surface coil is frequently used. The surface coil permits high-sensitivity reception of signals from a local region. The surface coil consists of a conductor formed in the shape of a circle or square with a diameter of ten centimeters to tens of centimeters and can receive magnetic resonance signals induced in a body portion on which it is placed at high sensitivity. Such a surface coil permits high-resolution imaging of a body portion such as a joint or the spinal column. This is very advantageous clinically.

However, every time a body portion for imaging is changed, the position of the surface coil has also to be changed. This is troublesome. That is, a subject under examination is placed on a top board with the surface coil placed between the subject and the top board or on the subject and entered into the gantry for NMR imaging. For imaging of another body portion of the subject the top board is drawn from the gantry to release the subject and position the surface coil on another body portion of the subject and the top board is entered into the gantry again. Namely, the position of the surface coil has to be changed every time a change is made from an imaging portion to another. Therefore, problems arise in that the NMR imaging time takes a long time and, in addition, the positioning of the surface coils is time-consuming.

SUMMARY OF THE INVENTION

It is therefore an object of the present invention to provide an RF coil system for use in a magnetic resonance imaging apparatus which permits high-sensitivity imaging of a plurality of body portions to be performed easily.

The object can be attained by the following RF coil system.

An RF coil system for use in a magnetic resonance imaging apparatus, the coil system being adapted to perform at least one of application of an excitation high-frequency magnetic field and detection of magnetic resonance signals, comprises:

a plurality of coil elements arranged at regularly spaced intervals without any overlap between the coil elements; and means for putting each of the coil elements into an operative state or an inoperative state individually.

The above object can also be attained by the following RF coil system.

An RF coil system for use in a magnetic resonance imaging apparatus, the coil system being adapted to perform at least one of application of an excitation high-frequency magnetic field and detection of magnetic resonance signals, comprises:

a plurality of coil elements arranged at regularly spaced intervals without any overlap between the coil elements;

means for putting each of the coil elements into an operative state or an inoperative state individually; and neutralizing means installed between adjacent ones of the coil elements for neutralizing inductive coupling between the coil elements.

Furthermore, the above object can also be attained by the following RF coil system.

An RF coil system for use in a magnetic resonance imaging apparatus, the coil system being adapted to perform at least one of application of an excitation high-frequency magnetic field and detection of magnetic resonance signals, comprises:

a plurality of coil elements arranged at regularly spaced intervals without any overlap between the coil elements;

means for putting each of the coil elements into an operative state or an inoperative state individually;

neutralizing means installed between adjacent ones of the coil elements for neutralizing inductive coupling between the coil elements;

tuning means for tuning at least one of the coil elements to a given frequency;

adder means for adding outputs of the tuning means; and conductors connected to the coil elements, the means, the neutralizing means and the adder means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

Figure 1:
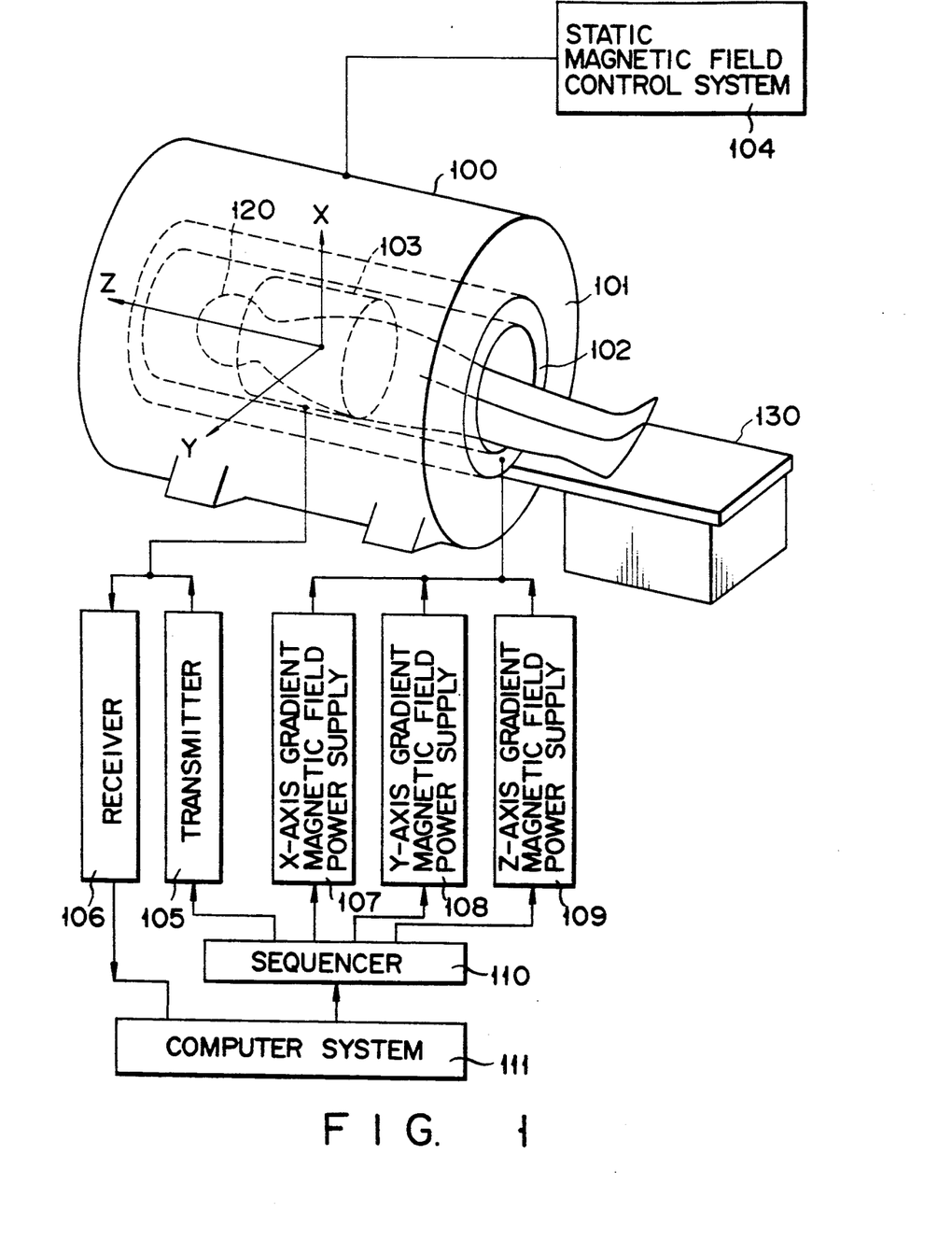
FIG. 1 illustrates the whole arrangement of a magnetic resonance imaging apparatus which can obtain tomography images.

Referring now to FIG. 1, a magnetic resonance imaging apparatus to which the present invention is applied includes a magnet assembly 100 which accommodates a subject under examination 120 and an examination couch 130 adapted to lead the subject 120 into the magnet assembly 100. The magnet assembly 100 incorporates a static magnetic field forming magnet 101 (which may have a static magnetic field compensating shim coil) consisting of one or a combination of a permanent magnet, a non-superconducting magnet and a superconducting magnet, X-, Y- and Z-axis gradient magnetic field forming coils 102 for forming gradient magnetic fields used to obtain position information of a magnetic resonance signal induced portion, and a probe 103 which is, for example, an RF coil system which serve as a transmit coil and a receive coil to transmit a rotating high-frequency magnetic field (an RF pulse) and receive induced magnetic resonance signals (MR signals). If the static magnetic field forming magnet 101 is of a superconducting type, a system for controlling the supply of a cooling medium to it will be provided. A static magnetic field control system 104 controls the supply of power to the magnet 101.

Figure 2:
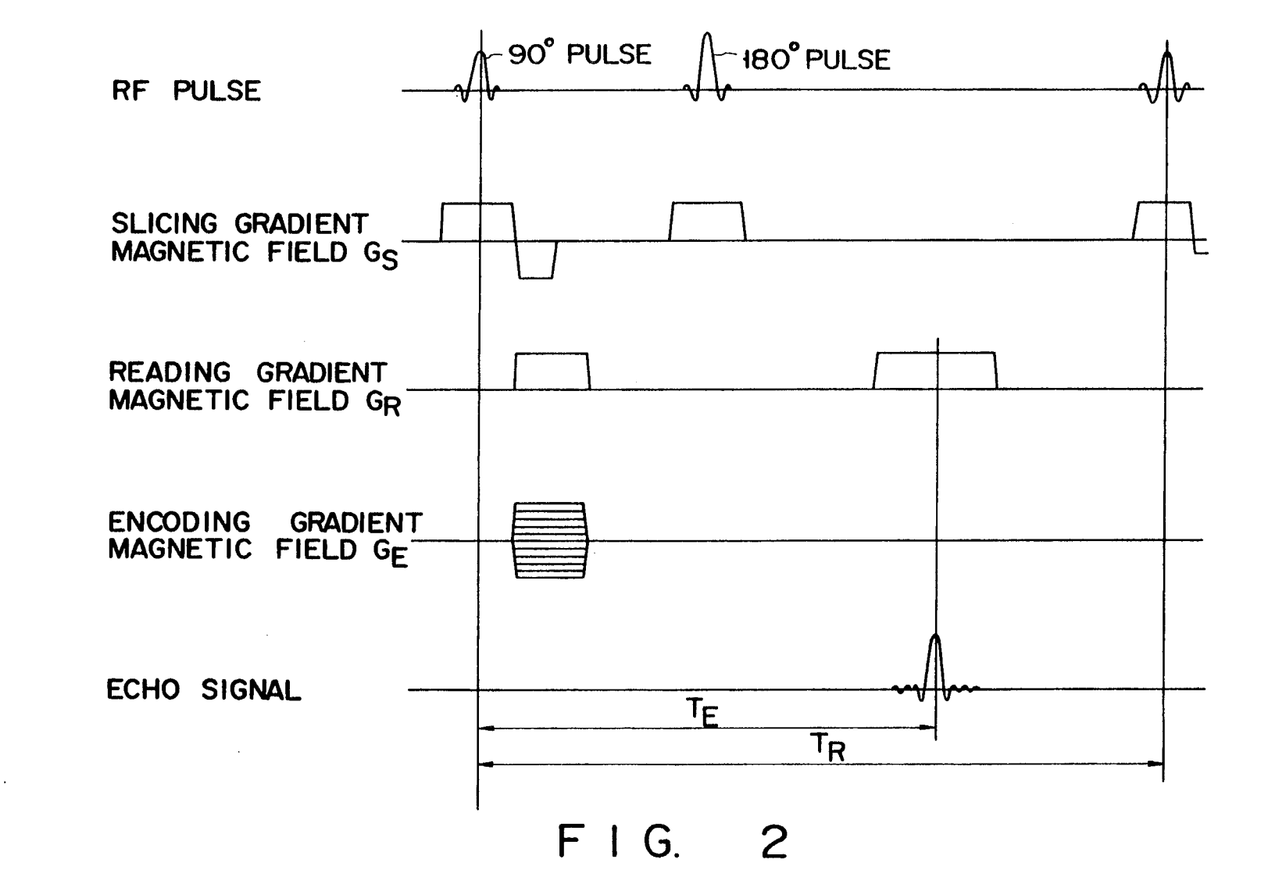
FIG. 2 illustrates a pulse sequence carried out by the apparatus of FIG. 1 to obtain a tomography image.

In addition to the magnet assembly 100 and the examination couch 130, the magnetic resonance imaging apparatus includes a transmitter 105 for controlling the transmission of an RF pulse, a receiver 106 for controlling the reception of induced MR signals, X-, Y- and Z-axis gradient magnetic field power supplies 107, 108 and 109 for controlling the excitation of the X-, Y- and Z-axis gradient magnetic field forming coils, respectively, a sequencer 110 for carrying out a tomography image generating pulse sequence shown in FIG. 2 and a computer system 111 for controlling these devices and processing and displaying received signals.

Here the pulse sequence shown in FIG. 2 utilizes, for example, a spin-echo method and is carried out by the sequencer 110 with the subject 120 placed in a static magnetic field. More specifically, the transmitter 105 is driven so that an RF pulse is transmitted from the transmit coil of the probe 103. The RF pulse is selective excitation pulse which is generally flip angle 90°. At the same time the RF pulse is applied, the gradient magnetic field power supplies 107, 108 and 109 are driven so that the gradient magnetic field forming coils 102 apply a gradient magnetic field Gz, serving as a slice-selection gradient magnetic field Gs, along the Z axis (let the Z axis be in the direction of the body axis of the subject 120). Thereby, a slice of the body of the subject 120 which is selected by the frequency of the selective excitation pulse and the magnitude of the slice-selection gradient magnetic field Gs is excited to resonance.

Next, the gradient magnetic field Gx in the X-axis direction and the gradient magnetic field Gy in the Y-axis direction are applied as a readout gradient field and a phase-encoding gradient field, respectively.

Subsequently, a 180° nonselective excitation pulse and a gradient magnetic field Gz in the Z-axis direction, serving as a slice-selection gradient field Gs, are applied and an echo signal is received by the receive coil of the probe 103 after echo time Te.

The pulse sequence is repeated a predetermined number of times at a repetition interval (period) Tr so that a group of echo signals is obtained. The echo signals may be Fourier transformed to produce a tomography image for the excited slice.

Figure 3:
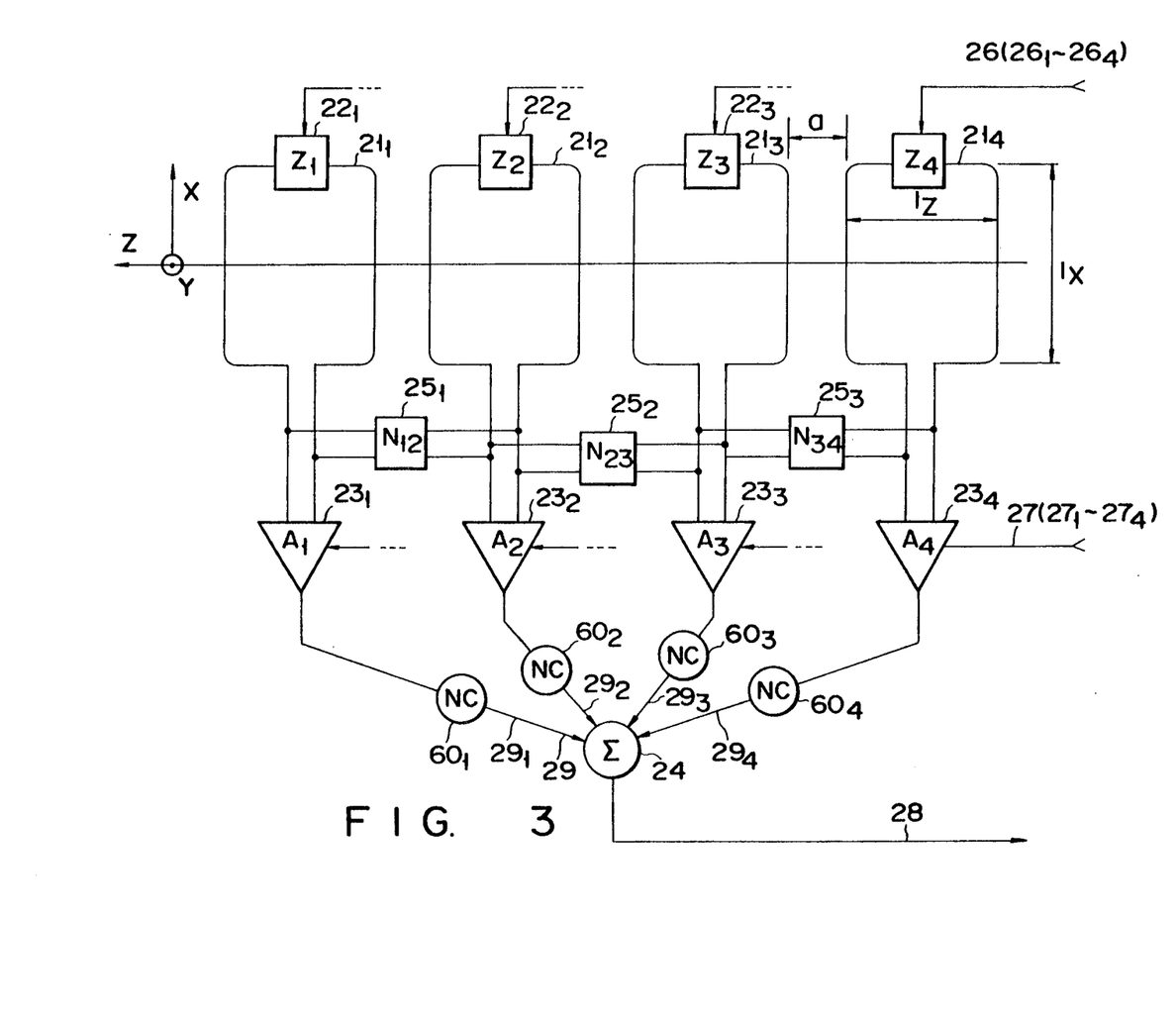
FIG. 3 is a circuit diagram of an RF coil system according to an embodiment of the present invention.

The present embodiment of the present invention has, in addition to the probe 103 which is an RF coil system serving as the transmit coil and the receive coil, an RF coil system shown in FIG. 3 and having the same function as the probe. The additional coil system is composed of four coil elements 211, 212, 213 and 214 each of which has a substantially rectangular shape. The coil elements are arranged in line along the Z-axis direction at intervals of a. Here the Z-axis direction coincides with the direction of the static magnetic field in the magnet assembly 100. In general, the Z-axis direction is made coincident with the direction of the body axis of the subject 120. Each of the coil elements 211 to 214 of substantially rectangular shape has a short side lz and a long side lx, the short side lz being oriented parallel to the Z axis.

The coil elements 211, 212, 213 and 213 (hereinafter designated as 21) incorporate RF blocking circuits 221, 222, 223 and 224 (hereinafter denoted as 22) (Z1, Z2, Z3, Z4), respectively. The coil elements 21 have their outputs connected to preamplifiers (A1, A2, A3, A4) 231, 232, 233 and 234 (hereinafter designated as 23). The outputs of the preamplifiers 23 are added together in an adder circuit 24 the output of which is coupled to a receiver not shown. Each of cancellation circuits (N12, N23, N34) 251, 252 and 253 (hereinafter designated as 25) is connected between the outputs of corresponding coil elements 21.

Reference characters 261, 262, 263 and 264 (hereinafter designated as 26) denote control lines of the RF blocking circuits 22, 271, 272, 273 and 274 (hereinafter designated as 27) denote control lines of the preamplifiers 23, 28 denotes an output line of the adder circuit 24, and 291, 292, 293 and 294 (hereinafter designated as 29) denotes lines to connect the outputs of the preamplifiers 23 to the input of the adder circuit 24.

When the directions of the coordinate axes are set as described above, magnetic resonance signals are virtually received by the side lz of each coil element. In order to take the image of, for example, the spinal column, however, it is desirable that lx be set to approximately 15 centimeters. When, for example, lx = 15 cm and lz = 15 cm, the distance from the surface of each coil element at which the signal strength becomes approximately half the signal strength at the coil surface is approximately seven centimeters, which is most suitable for imaging of the spinal column of an average human body.

According to calculations, in order to make uniform magnetic fields formed at a distance of about seven centimeters from the coil surface by the coil elements 21, it is desirable that the spacing a between adjacent coil elements 21 be set to approximately less than one centimeter.

Generally, the shorter the gaps among coil elements, the greater the uniformity of sensitivity. However, when these gaps are too short, the lx sides of the adjacent coil elements are magnetically coupled very firmly. In this case, the energy loss in each coil element increases, inveitably reducing the operating efficiency of the coil system as a whole.

Figure 7:
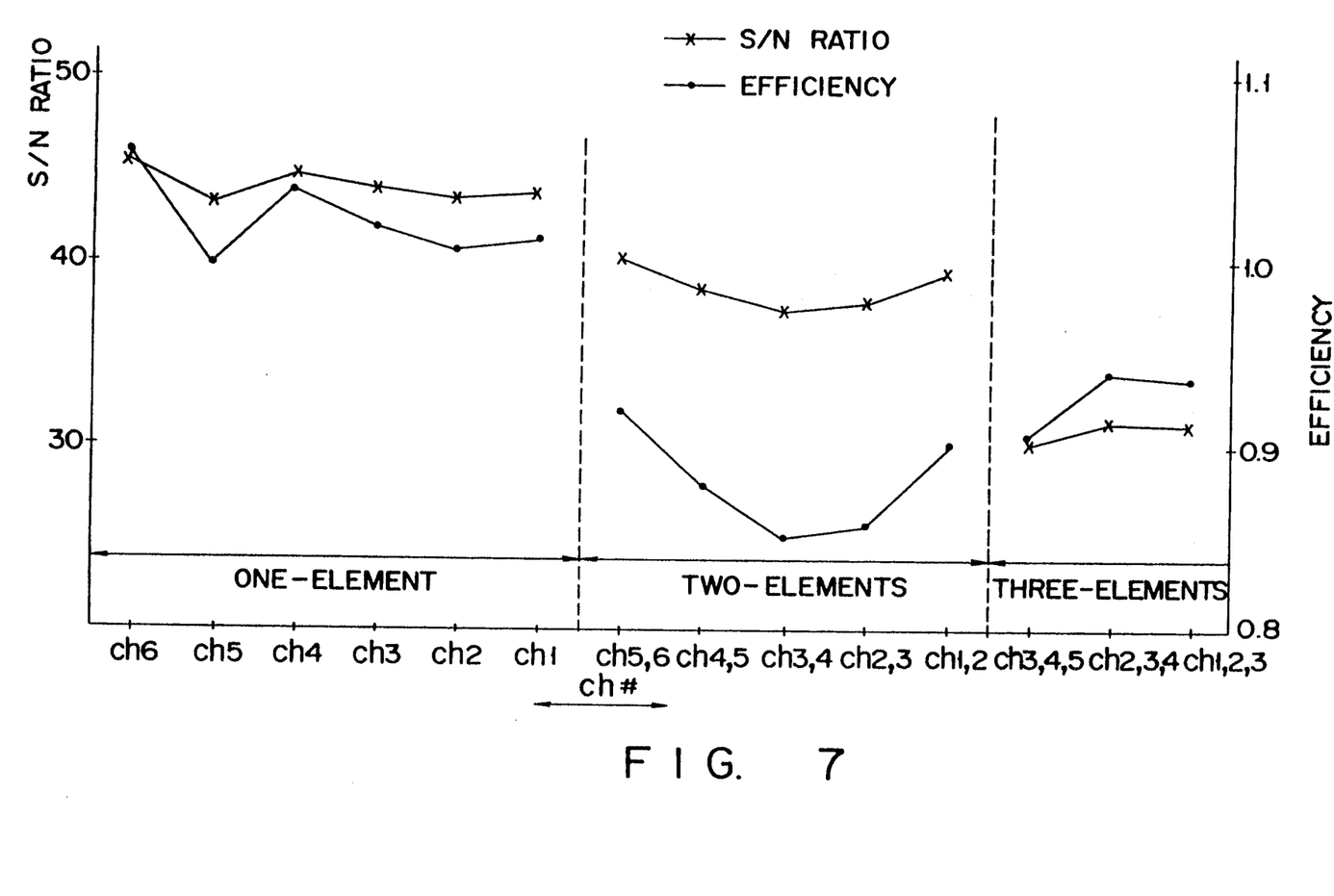
FIGS. 7 and 8 illustrate S/N characteristics and efficiency characteristics of an RF coil system consisting of a single coil element, an RF coil system composed of two coil elements and an RF coil system composed of three coil elements.
Figure 8:
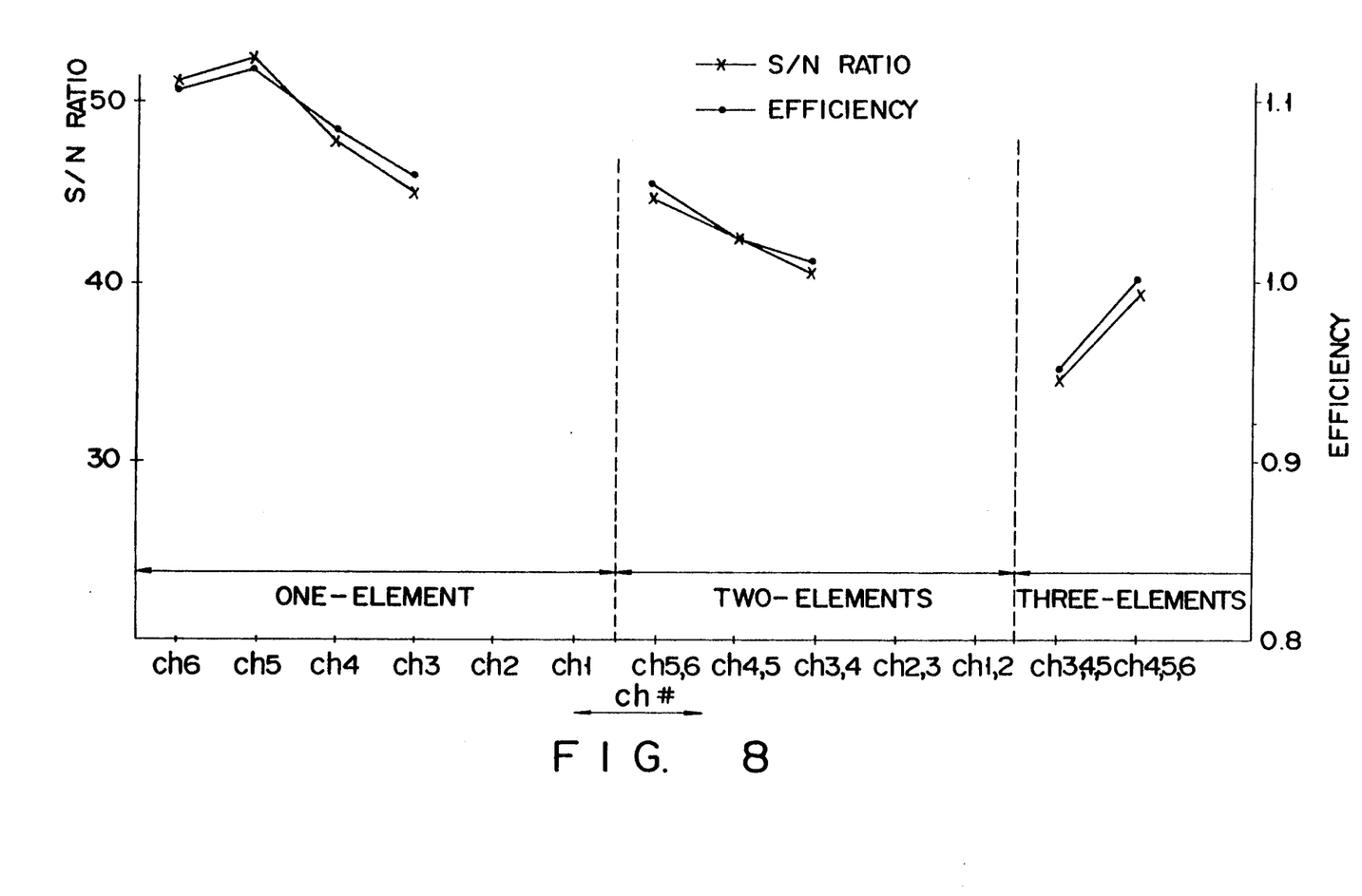

Furthermore, in respect of receive efficiency as well, it is confirmed by calculations that the coil spacing a is preferably set to about one centimeter. Typical examples of experiments are shown in FIGS. 7 and 8. In FIG. 7 there are shown graphs which illustrate the S/N characteristics and efficiency characteristics of an RF coil system having only one coil element, an RF coil system having two coil elements and an RF coil system having three coil elements in the case of a=13 mm. FIG. 8 illustrates the S/N characteristics and efficiency characteristics of the three types of RF coil systems in the case of a=8 mm. In these examples the receive efficiency in a region of interest differs by as much as 10%. To make up the difference, the imaging time is substantially doubled. As a result of this, the burden on a subject under examination will be lightened.

Figure 9:
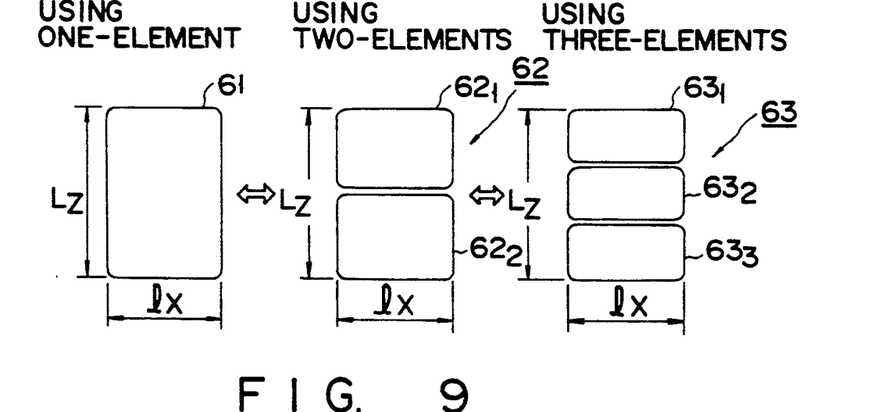
FIG. 9 illustrates exemplary layouts of the single-element RF coil system, the two-element RF coil system and the three-element RF coil system which have their characteristics compared in FIGS. 7 and 8.

Here the experiments in FIGS. 7 and 8 will be explained. That is to say, as shown in FIG. 9, an RF coil system 61 composed of only one coil element, an RF coil system 62 composed of two coil elements 621 and 622 and an RF coil system 63 composed of three coil elements 631, 632 and 633 are prepared The size of each of the RF coil systems 61, 62 and 63 is defined by Lz and lx as shown.

FIG. 7 illustrates the S/N characteristics and efficiency characteristics of the RF coil systems in the case of a=13 mm, while FIG. 8 illustrate like characteristics of the RF coil systems in the case of a=8 mm. Here the efficiency indicates the extent to which the S/N ratio when the two-element RF coil system 62 is used is decreased as compared with the S/N ratio when the one-element RF coil system 61 of the same size as the coil system 62 is used.

Four to six coil elements 21 will suffice in order to cover a range from a thoracic vertebra to a lumbar vertebra. The distance between thoracic and lumbar vertebrae is approximately 60 centimeters. Thus, four coil elements will suffice when lz=15 cm, while six coil elements will suffice when lz=10 cm.

Each of the RF blocking circuits 22 is adapted to avoid unwanted magnetic coupling between its respective individual coil element 21 and the excitation RF magnetic field. It is desirable that each coil element incorporate one or more RF blocking circuits. Such an RF blocking circuit can readily be constructed of a PIN diode, a high-speed switching diode or a combination of the PIN diode and the high-speed switching diode and an inductor L and a capacitor C. In the case of a PIN diode, a separate signal line for driving the diode is needed in addition to the signal line indicated at 22.

When the coil elements 21 are arranged as shown in FIG. 3, they are apt to interfere with one another. Particularly, the interference of one coil element with its adjacent coil element is serious so that undesirable effects (for example, a detuned condition) are produced. For this reason, the cancellation circuit 21 is connected between adjacent coil elements. An example of such a cancellation circuit is disclosed in Japanese Unexamined Patent Publication No. 63-139535, according to which a cancellation circuit serial is serial connected to two or more receive coils.

According to an invention, which is similar to the present embodiment, disclosed in Japanese Unexamined Patent Publication No. 63 - 234957, coil elements are arranged so that they overlap each other for the purpose of canceling the interference out. In this case, the spacing a between adjacent coil elements cannot be set and thus the sum of magnetic fields produced by the coil elements 21 at a desired distance from the coil surface may not be made sufficiently uniform. According to the present invention, as illustrated in FIG. 3, the coil elements 21, unlike the invention disclosed in Japanese Unexamined Patent Publication, are independent of one another.

Figure 4:
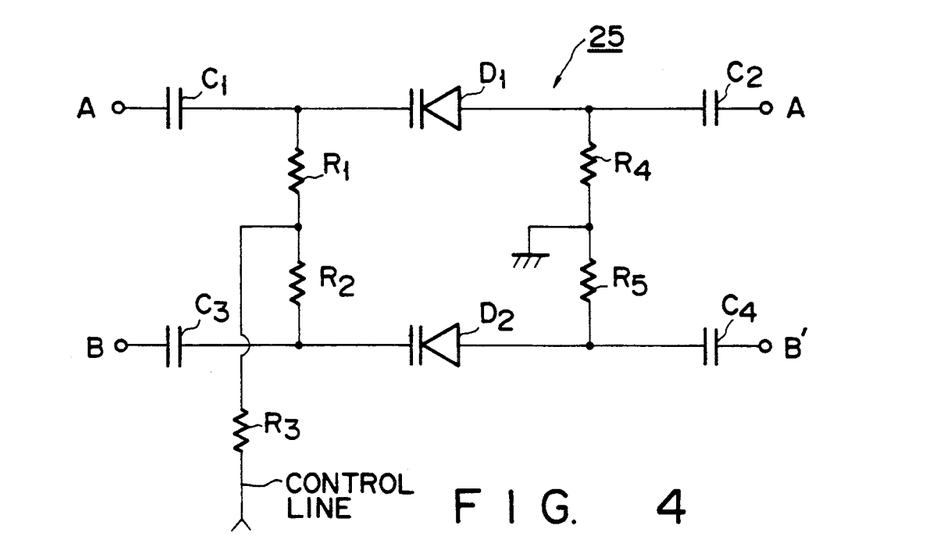
FIG. 4 is a detailed circuit diagram of the cancellation circuit of FIG. 3.

The cancellation circuit 25, which may be constructed as in the invention disclosed in Japanese Unexamined Patent Publication No. 63-139535 as described above serial connection, can be constructed as illustrated in FIG. 4. In this figure, D1 and D2 denote varactor diodes and R1 to R5 denote resistors provided for the mere purpose of applying direct-current bias to the varactor diodes D1 and D2. It is desired that the resistors R1 to R5 have sufficiently high resistance so that the leakage of an RF pulse to the signal line 28 may not occur.

On the other hand, C1 to C4 denote capacitors adapted to prevent the direct-current bias from being applied to separate circuits and may be omitted if the direct-current bias has not any effects on the separate circuits. By selecting the values of C1 to C4 suitably, the equivalent capacitance between terminals A and A' and between terminals B and B' can advantageously be made small as needed.

Figure 5:
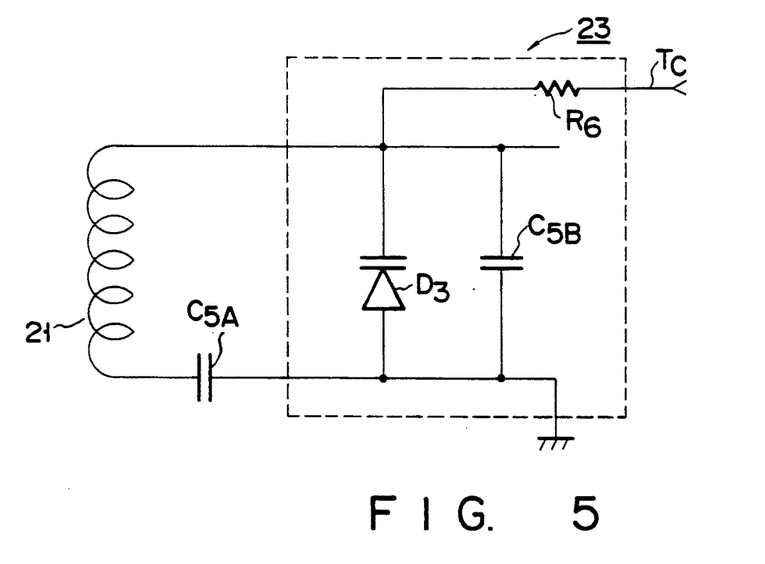
FIG. 5 is a detailed circuit diagram of the resonant circuit of FIG. 3.

Each of the preamplifiers 23 (A1, A2, A3, A4) comprises a resonant circuit section for producing resonance and an amplifier section for amplifying a signal at resonance. As illustrated in FIG. 5, the resonant circuit can readily be constructed from a varactor diode D3, a fixed capacitor (which is not necessarily needed) and a signal line Tc for controlling the varactor diode D3. The amplifier section is enabled or disabled by the signal line 27. For example, this will be achieved by varying a direct-current operating point of a transistor.

Each of the preamplifiers 23 has a current feedback loop which can restrict the Q value of the corresponding coil element 21 to 100 or below without causing a substantial decrease in S/N ratio. Thereby, variations in the resonant state of each coil element and the interference between coil elements can be suppressed by variations in loads imposed on the coil elements.

It is important that RF blocking circuit 22, preamplifier 23, cancellation circuit 25 and neutralizing circuit (NC) 60 be disposed on opposed sides of each coil element (in FIG. 3, the short sides which are opposed in the direction normal to the body axis of the subject). If those circuits were disposed on the sides lz in FIG. 3, not only the desired coil spacing a could not be secured but also the main imaging plane (in general, the coil plane surrounded with the sides of coil element 21 or planes above and below the coil plane) would contain those circuits and thereby NMR images obtained would be adversely affected The RF blocking circuit 22 and the preamplifier 23 are enabled or disabled by the signal lines 26 and 27, respectively, shown in FIG. 3. In order to put each of the coil elements 21 into operation, all of the preamplifiers 23 are enabled and all of the RF blocking circuits are disabled, namely, placed in RF non-blocking state. However, the RF blocking circuits 22 must be placed in the operative state (i.e., RF pulse blocking state) at the time of application of an RF pulse. A logic circuit therefor can easily be implemented by a combination of a system RF gating pulse, a select signal to each coil element and signal lines 26 and 27. The logic circuit may be contained within each coil element 21 or disposed on the system side.

The adder circuit 24 is adapted to add output signals of the preamplifiers 23. Its function of addition can be implemented by selecting the input impedance of the adder circuit 24 and the output impedance of the preamplifiers 23 suitably. In this case, however, there is the possibility that unwanted reactance components are associated with the lines 29 and thus the adder function is not performed properly. In view of such possibility, neutralizing circuits (NC) 60 (601, 602, 603, 604) are each connected between the adder circuit 24 and respective individual preamplifiers 23, which are adapted to cancel the unwanted reactance components out. The neutralizing circuits 60 can each be constructed of a simple network comprising a reactor L and a capacitor C.

Figure 6:
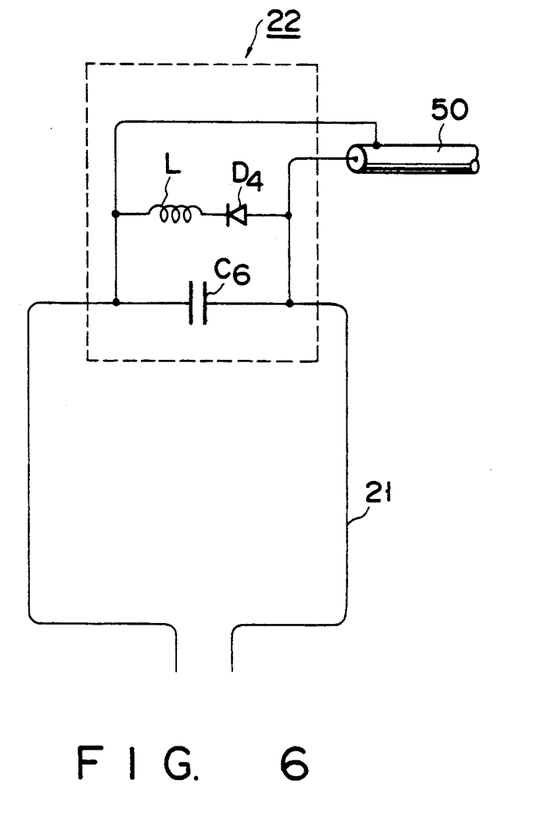
FIG. 6 is a detailed circuit diagram of the RF blocking circuit of FIG. 3.

As illustrated in FIG. 6, the RF blocking circuit 22 is constructed from a capacitor C6, a reactor L and a PIN diode D4 and supplied with a control signal through a coaxial line 50.

Figure 10:
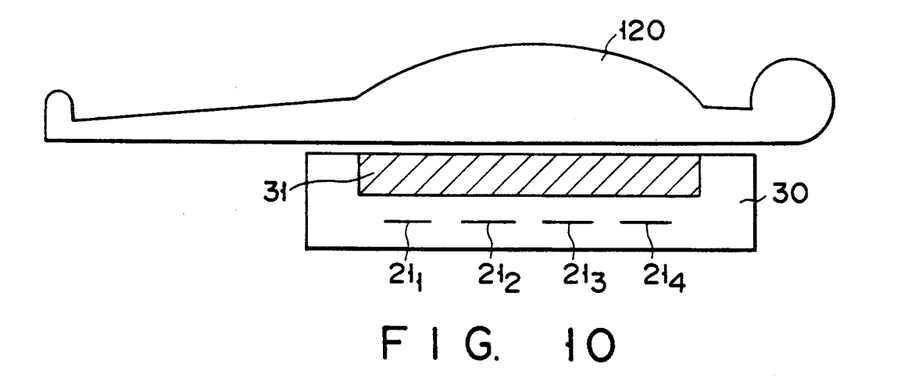
FIG. 10 is a side view showing the RF coil system of the present invention incorporated into a top board of an examination couch.

In FIG. 10, the coil elements 21 of FIG. 1 are disposed within a cover 30 and a buffer member 31 is disposed between the subject 120 and the coil elements 21 so that the subject may not undergo any pain from the form of the coil elements. The buffer member 31 is placed very close to the coil elements 21, thus preventing the S/N ratio from decreasing. The buffer member 31 alone or the buffer member and the cover 30 are preferably made of a non-magnetic, non-metallic material having a thickness of 1 mm to 50 mm so that the subject may not undergo any pain from contact with the buffer member.

Figure 11:
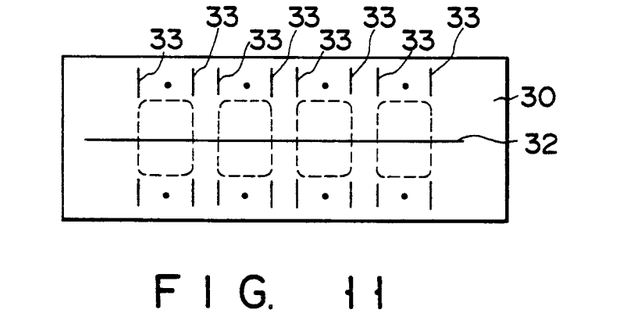
FIG. 11 is a plan view of the top board of FIG. 10.
Figure 12:
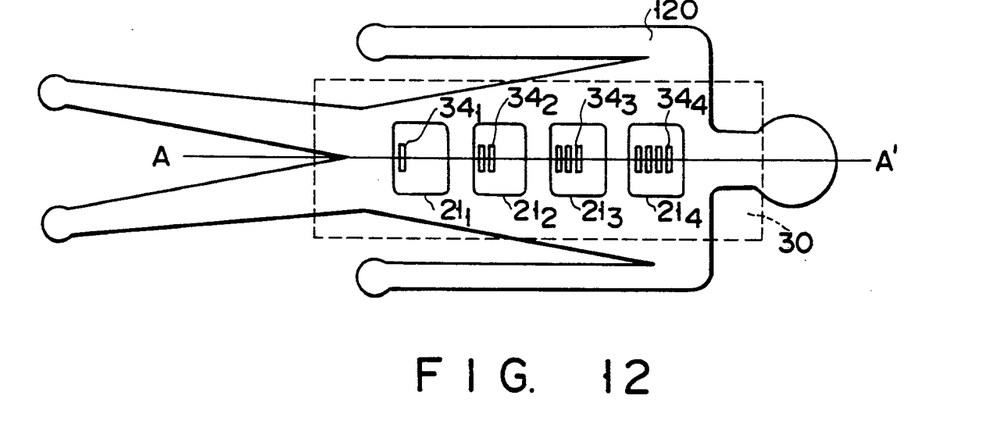
FIG. 12 is a plan view showing the relationship between the coil system with markers and a subject under examination.
Figure 13:
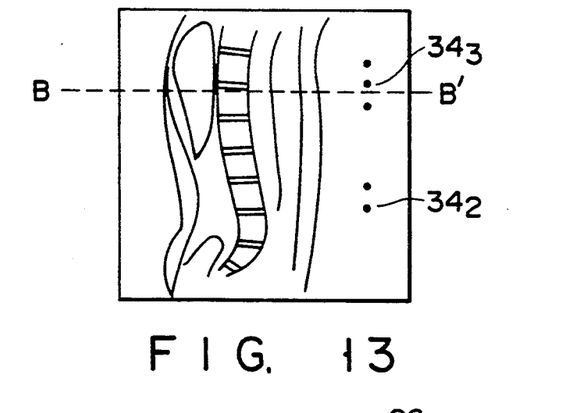
FIG. 13 illustrates an NMR image obtained in the arrangement of coils of FIG. 12.

FIG. 11 illustrates the cover 30 of the RF coil system of FIG. 3 and the position of each of the coil elements 21 is shown dotted. Printing of lines indicating the center 32 of each coil elements 21 and its both ends 33 on the cover 30 as illustrated in FIG. 11 would be convenient to position the subject 120. In this case, a body portion supposed to be morbid could be set in the center of one of the coil elements 21 and the efficiency of examination could be increased It is useful to print information on the position of each coil element on an NMR image. Suppose that, when markers 34 (341, 342, 343, 344) producing a magnetic resonance signal are disposed in the vicinity of respective coil elements as illustrated in FIG. 12 and a sectional NMR image is taken along the line A - A', such an image as shown in FIG. 13 is obtained. When a subsequent sectional NMR image is taken along the line B - B', it will be appreciated that, since there are three markers, the coil element 213 alone has only to be put into operation. Of course, all the coil elements may be operated. In general, however, the smaller the size, the greater the S/N ratio. In this case, therefore, it is preferable that only the coil element 213 be operated.

Figure 14:
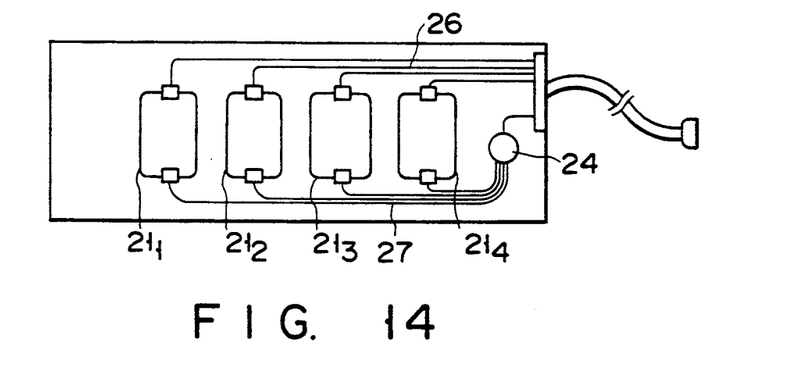
FIG. 14 illustrates an arrangement of signal lines of the RF coil system of the present invention.

FIG. 14 illustrates the arrangement of the control lines shown in FIG. 3. If the loop formed by each coil element were crossed by the control lines 26 and 27, unwanted shading would be caused in an NMR image. For this reason, the control lines 26 and 27 are arranged so that they may not cross the loops of the coil elements 21.

Figure 15:
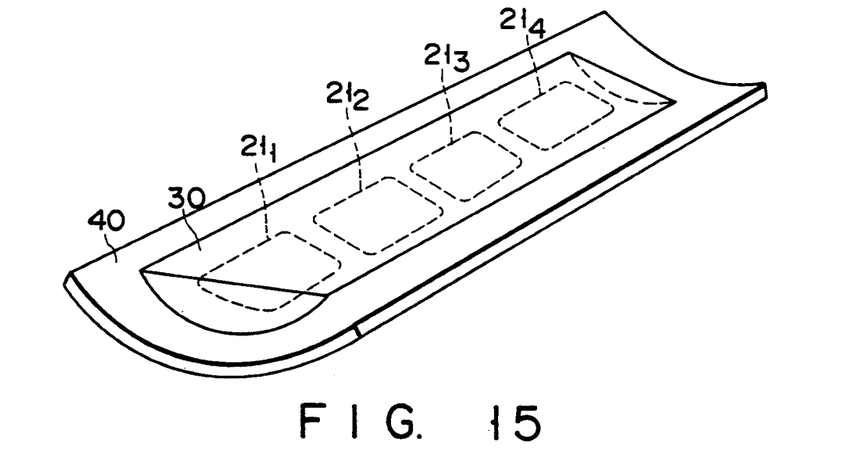
FIG. 15 is a perspective view showing an arrangement of the RF coil system of the present invention in the top board.

With the RF coil system of the present invention, magnetic decoupling circuits are used. Thus, it is unnecessary to remove the RF coil system from the top board even when another coil is used. If, therefore, the buffer member 31 and the cover 30 supporting the coil elements 21 are made to fit the shape of the top board 40, a mat not shown can also be used. This eliminates the mat replacing work.

The present invention need not limited to the above-described embodiment. For example, each coil element is not limited to a rectangular shape and may be formed in the shape of a circle having a diameter of, for example, 15 to 20 centimeters. In addition, the present invention may be embodied in still other ways without departing the spirit thereof.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An RF coil system for use in a magnetic resonance imaging apparatus, said coil system being adapted to perform at least one of application of an excitation high-frequency magnetic field and detection of magnetic resonance signals, comprising:
   a plurality of coil elements arranged at regularly spaced intervals without any overlap between said coil elements; and
   means for putting each of said coil elements into an operative state or an inoperative state individually.

2. An RF coil system according to claim 1, in which said coil elements are arranged at intervals of about one centimeters without overlap between said coil elements.

3. An RF coil system according to claim 1, in which said coil elements are arranged on a top board of a bed on which a subject under examination is placed.

4. An RF coil system according to claim 1, in which each of said coil elements incorporates a marker adapted to produce a magnetic resonance signal.

5. An RF coil system according to claim 1, in which said coil elements are arranged on a top board of a bed on which a subject under examination is placed and each of said coil elements incorporates a marker adapted to produce a magnetic resonance signal.

6. An RF coil system for use in a magnetic resonance imaging apparatus, said coil system being adapted to perform at least one of application of an excitation high-frequency magnetic field and detection of magnetic resonance signals, comprising:
   a plurality of coil elements arranged at regularly spaced intervals without any overlap between said coil elements;
   means for putting each of said coil elements into an operative state or an inoperative state individually; and neutralizing means installed between adjacent ones of said coil elements for neutralizing inductive coupling between said coil elements.

7. An RF coil system according to claim 6, in which said coil elements are arranged at intervals of about one centimeters without overlap between said coil elements.

8. An RF coil system according to claim 6, in which said coil elements are arranged on a top board of a bed on which a subject under examination is placed.

9. An RF coil system according to claim 6, in which each of said coil elements incorporates a marker adapted to produce a magnetic resonance signal.

10. An RF coil system according to claim 6, in which said coil elements are arranged on a top board of a bed on which a subject under examination is placed and each of said coil elements incorporates a marker adapted to produce a magnetic resonance signal.

11. An RF coil system for use in a magnetic resonance imaging apparatus, said coil system being adapted to perform at least one of application of an excitation high-frequency magnetic field and detection of magnetic resonance signals, comprising:
 a plurality of coil elements arranged at regularly spaced intervals without any overlap between said coil elements;
 means for putting each of said coil elements into an operative state or an inoperative state individually;
 neutralizing means installed between adjacent ones of said coil elements for neutralizing inductive coupling between said coil elements;
 tuning means for tuning at least one of said coil elements to a given frequency;
 adder means for adding outputs of said tuning means; and
 conductors connected to said coil elements, said means, said neutralizing means and said adder means.

12. An RF coil system according to claim 11, in which said means, said neutralizing means and said conductors are disposed outside said coil elements.

13. An RF coil system according to claim 11, in which said coil elements are arranged on a top board of a bed on which a subject under examination is placed.

14. An RF coil system according to claim 11, in which each of said coil elements incorporates a marker adapted to produce a magnetic resonance signal.

15. An RF coil system according to claim 11, in which said coil elements are arranged on a top board of a bed on which a subject under examination is placed and each of said coil elements incorporates a marker adapted to produce a magnetic resonance signal.

* * * * *